(12) United States Patent
Peng et al.

(10) Patent No.: US 7,965,505 B2
(45) Date of Patent: Jun. 21, 2011

(54) AIRFLOW GUIDING COVER

(75) Inventors: Wen-Tang Peng, Taipei Hsien (TW); Xin-Hu Gong, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/644,013

(22) Filed: Dec. 22, 2009

(65) Prior Publication Data

US 2011/0085303 A1    Apr. 14, 2011

(30) Foreign Application Priority Data

Oct. 9, 2009    (CN) .......................... 2009 1 0308118

(51) Int. Cl.
*H05K 7/20* (2006.01)

(52) U.S. Cl. .................. 361/695; 361/694; 454/184

(58) Field of Classification Search ............ 361/679.49, 361/694, 695; 454/184
See application file for complete search history.

(56) References Cited

U.S. PATENT DOCUMENTS

| | | | |
|---|---|---|---|
| 6,148,907 A * | 11/2000 | Cheng ........................... | 165/121 |
| 6,343,011 B1 * | 1/2002 | Yu ................................. | 361/695 |
| 6,400,568 B1 * | 6/2002 | Kim et al. ..................... | 361/697 |
| 6,464,578 B1 * | 10/2002 | Chin et al. .................... | 454/184 |
| 6,567,267 B1 * | 5/2003 | Wang ............................ | 361/695 |
| 6,951,446 B2 * | 10/2005 | Hung ........................ | 415/213.1 |
| 6,981,669 B2 * | 1/2006 | Ishihara et al. ............ | 242/348.2 |
| 7,573,712 B2 * | 8/2009 | Wu et al. ....................... | 361/695 |
| 7,643,292 B1 * | 1/2010 | Chen ............................. | 361/695 |
| 2005/0073812 A1 * | 4/2005 | Lin ................................ | 361/695 |
| 2005/0174732 A1 * | 8/2005 | Lin ................................ | 361/695 |
| 2007/0236882 A1 * | 10/2007 | Chen ............................. | 361/695 |
| 2011/0014861 A1 * | 1/2011 | Tsai et al. ..................... | 454/184 |

* cited by examiner

Primary Examiner — Gregory D Thompson
(74) Attorney, Agent, or Firm — Zhigang Ma

(57) ABSTRACT

An airflow guiding cover includes a first airflow guiding portion, a second airflow guiding portion connected to an end of the first airflow guiding portion, and a third airflow guiding portion connected to an opposite end of the first airflow guiding portion. The first airflow guiding portion is collapsible and extendable along a first direction and flexible along a second direction perpendicular to the first direction, to enable the airflow guiding cover to fit for different system layout.

19 Claims, 4 Drawing Sheets

AIRFLOW GUIDING COVER

BACKGROUND

1. Technical Field

The present disclosure relates to an airflow guiding cover.

2. Description of Related Art

An electronic device, such as a computer or a server, generally includes an airflow guiding cover over a heat generating component and a heat sink. Opposite openings of the airflow guiding cover correspondingly face a fan and a vent of the electronic device. Heat produced by the heat generating component is discharged out of the electronic device through the vent, by action of the fan and the guidance of the airflow guiding cover. However, guiding covers are not adjustable for different electronic devices, airflow guiding covers with different configurations must be made according to system layout of the electronic devices.

DETAILED DESCRIPTION

Figure 1:
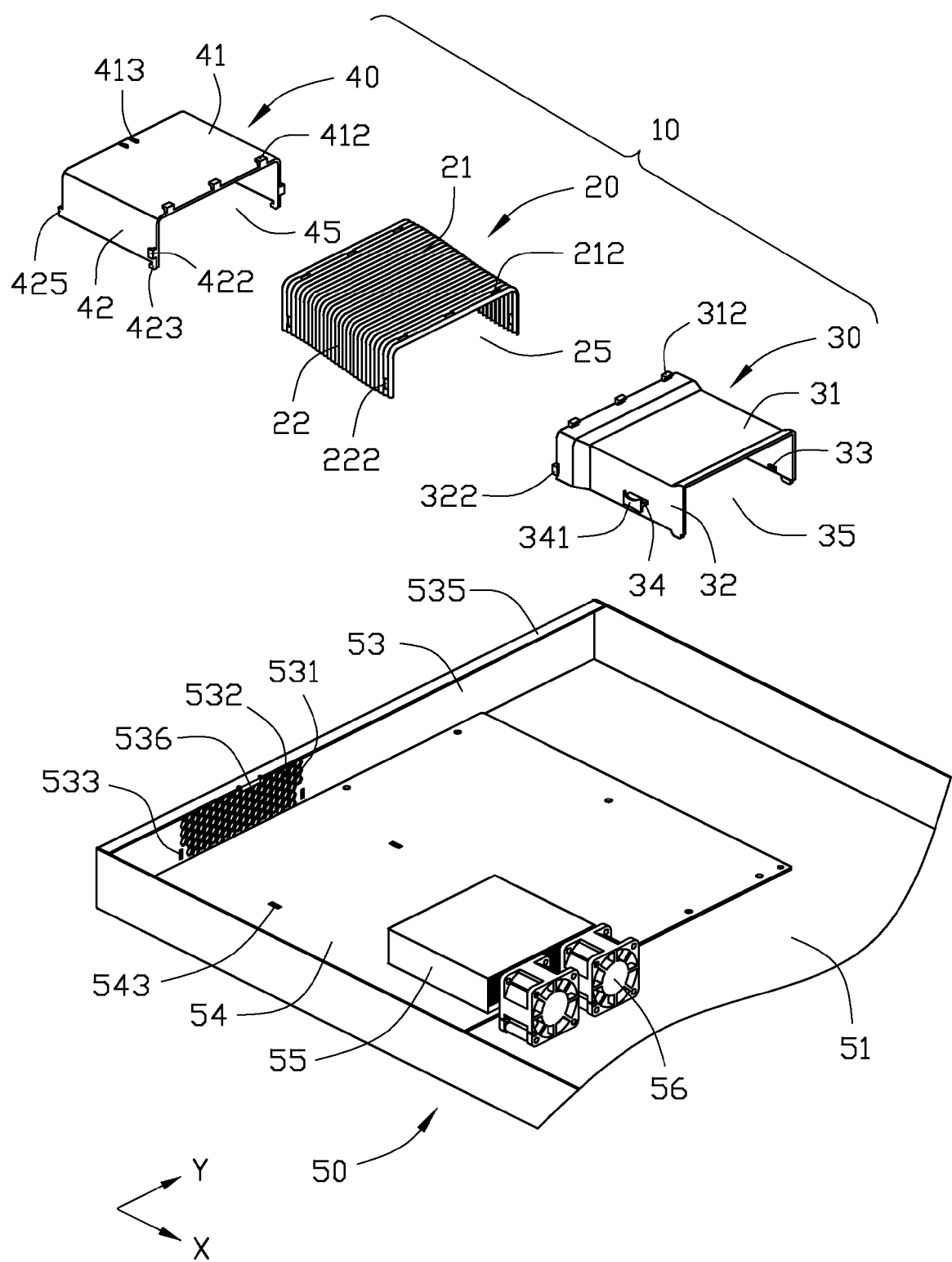
FIG. 1 is an exploded, isometric view of a first embodiment of an airflow guiding cover together with an electronic device.

Referring to FIG. 1, an airflow guiding cover 10 according to a first embodiment of the present disclosure is provided to be mounted to an electronic device 50. The airflow guiding cover 10 includes an adjustable first airflow guiding portion 20, a second airflow guiding portion 30, and a third airflow guiding portion 40.

The first airflow guiding portion 20 is substantially U-shaped, and includes a rectangular-shaped top wall 21, and two sidewalls 22 extending down from opposite ends of the top wall 21. Two openings 25 are defined in opposite sides of the first airflow guiding portion 20, bounded by the top wall 21 and sidewalls 22. Three notches 212 are defined in the top wall 21 adjacent to each opening 25, and a notch 222 is defined in each sidewall 22 adjacent to each opening 25. The top wall 21 and the sidewalls 22 are parallel to a first direction X, and are configured in an accordion structure and so are collapsible and extendable along the first direction X and flexible along a second direction Y, which is perpendicular to the first direction X and parallel to the top wall 21. In this embodiment, the first airflow guiding portion 20 is made of plastic material. In another embodiment, the first airflow guiding portion 20 may be made of a plurality of metal pieces movably connected one by one.

The second airflow guiding portion 30 is substantially U-shaped, and includes a rectangular-shaped top wall 31, and two sidewalls 32 extending down from opposite ends of the top wall 31. Two openings 35 are defined in opposite sides of the second airflow guiding portion 30, bounded by the top wall 31 and sidewalls 32. Three hooks 312 protrude outwardly from the top wall 31 adjacent to one of the openings 35, and a hook 322 protrudes outwardly from each sidewall 32 adjacent to the opening 35. A latch 33 protrudes from an inner side of each sidewall 32, adjacent to the other opening 35. An operating portion 34 protrudes from an outer side of each sidewall 32 adjacent to the corresponding latch 33. A handle 341 is formed on a distal end of each operating portion 34, away from the corresponding sidewall 32.

The third airflow guiding portion 40 is substantially U-shaped, and includes a rectangular-shaped top wall 41, and two sidewalls 42 extending down from opposite ends of the top wall 41. Two openings 45 are defined in opposite sides of the second airflow guiding portion 40, bounded by the top wall 41 and sidewalls 42. Three hooks 412 protrude outwardly from the top wall 41 adjacent to one of the openings 45, and two triangular-shaped blocks 413 protrude outwardly from the top wall 41 adjacent to the other one of the openings 45. A hook 422 protrudes outwardly from each sidewall 42 adjacent to the hooks 412. A catch 423 extends down from a bottom of each sidewall 42, adjacent to the hook 422. A protrusion 425 extends from an end of each sidewall 42, opposite to the catch 423 and adjoining the corresponding opening 45. The blocks 413 cooperate with the protrusions 425 to form a first locking mechanism.

The electronic device 50 includes a bottom wall 51 and an end wall 53 perpendicular to the bottom wall 51. Two spaced latching holes 533 are defined in the end wall 53. A plurality of vents 532 is defined in the end wall 53 between the latching holes 533, to form a heat dissipating area 531. A bent plate 535 perpendicularly extends from a top of the end wall 53 towards an inside of the electronic device 50. A stop plate 536 extends down from the bent plate 535 towards the heat dissipating area 531. The stop plate 536 cooperates with the latching holes 533 to form a second locking mechanism, corresponding to the first locking mechanism of the third airflow guiding portion 40. A circuit board 54 is installed on the bottom wall 51. The circuit board 54 includes a heat generating component (not shown), and a heat sink 55 installed on the heat generating component. Two spaced elongated slots 543 are defined in the circuit board 54 between the heat generating component and the heat dissipating area 531 of the end wall 53. Two fans 56 are installed on the bottom wall 51 aligned with the heat sink 55.

Figure 2:
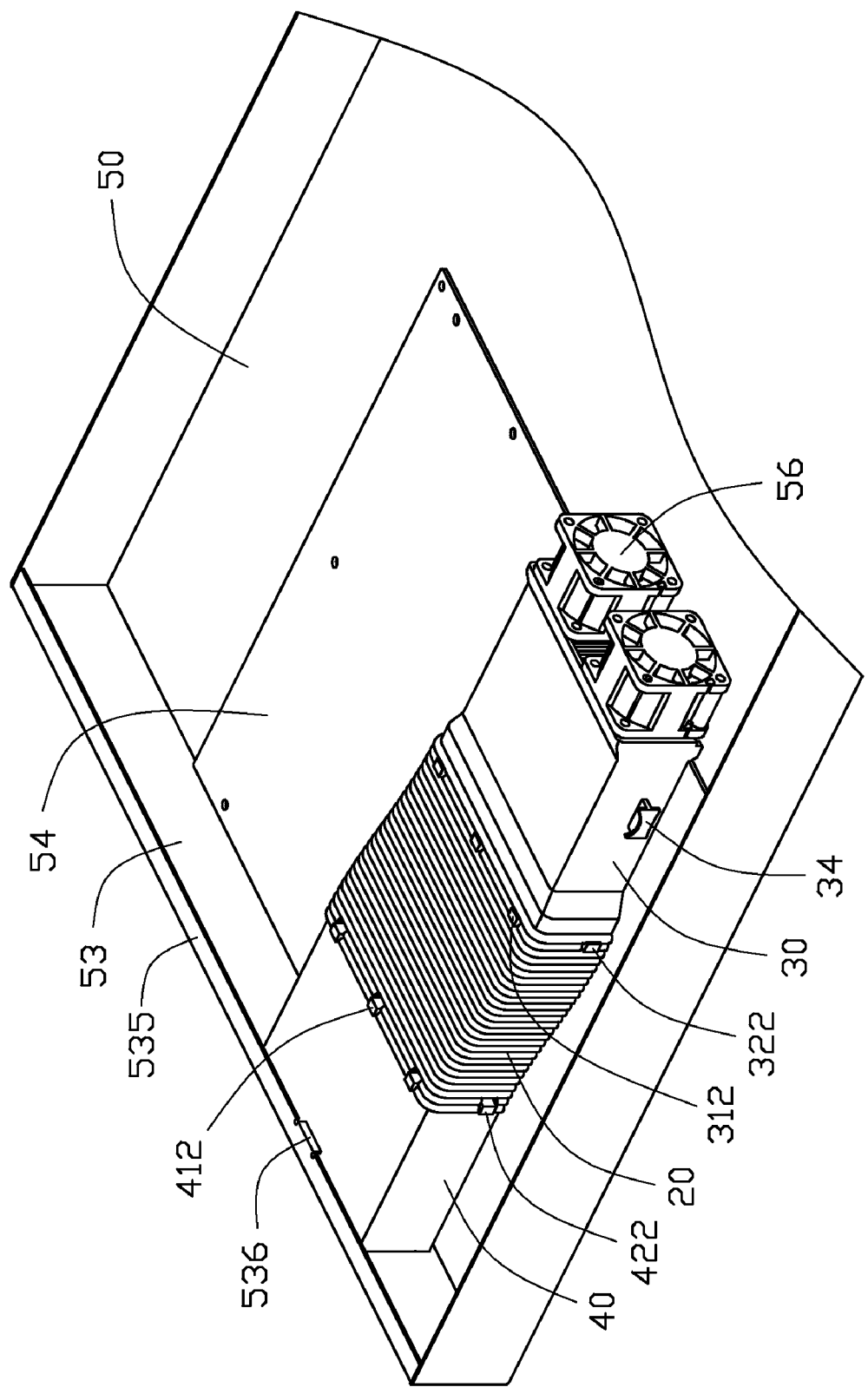
FIG. 2 is an assembled, isometric view of the airflow guiding cover and the electronic device of FIG. 1.
Figure 3:
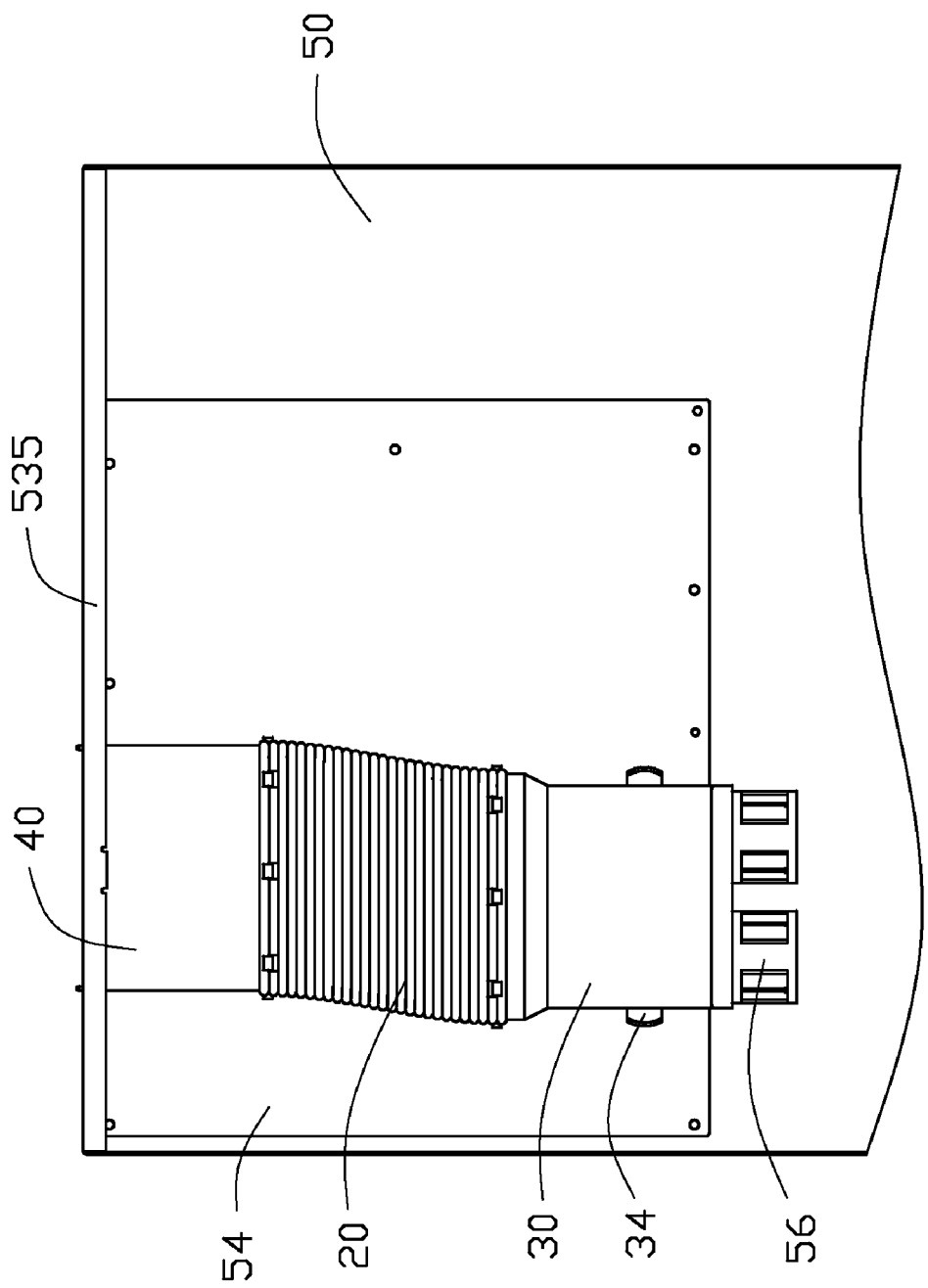
FIG. 3 is a top plan view of the airflow guiding cover and the electronic device of FIG. 2.

Referring to FIGS. 2 and 3, in assembly, the handles 341 of the operating portions 34 of the second airflow guiding portion 30 are pulled outwardly, to allow the sidewalls 32 to deform outwardly. The second airflow guiding portion 30 is placed on the circuit board 54 and covers the heat generating component and the heat sink 55. One of the openings 35 away from the hooks 312 and 322 of the second airflow guiding portion 30 is arranged to align with the fans 56. The handles 341 of the operating portions 34 are released, to allow the sidewalls 32 to be restored, and the latches 33 on the inner sides of the sidewalls 32 to engage with a bottom of the heat sink 55. Thereby, the second airflow guiding portion 30 is assembled. The third airflow guiding portion 40 is placed on the circuit board 54, with the protrusions 425 facing the end wall 53, and the catches 423 of the third airflow guiding portion 40 being correspondingly inserted into the slots 543 of circuit board 54. The third airflow guiding portion 40 is pushed towards the end wall 53, to allow the catches 423 to slide along the slots 543. The blocks 413 of the top wall 41 of the third airflow guiding portion 40 pass through the stop plate 536 and engage with an inner side of the stop plate 536 facing the end wall 53. The protrusions 425 correspondingly engage in the latching holes 533 of the end wall 53. The third airflow guiding portion 40 abuts against the end wall 53. The catches 423 correspondingly engage in the slots 543. Thereby, the third airflow guiding portion 40 is assembled. The first airflow guiding portion 20 is placed between the second and third airflow guiding portions 30 and 40, and stretched or compressed in the first direction X, and bent in the second direction Y, to allow the notches 212 and 222 adjacent to the openings 25 to correspondingly align with the hooks 312 and 322 of the second airflow guiding portion 30, and the hooks 412 and 422 of the third airflow guiding portion 40. Thereby, the first airflow guiding portion 20 is fixed, and the airflow guiding cover 10 is assembled.

In use, air is blown into the airflow guiding cover 10 by the fans 56. The air passes through the heat sink 55, and is heated through heat exchange with the heat sink 55. Heated air is blown out of the electronic device 50 by the fans 56 through the plurality of vents 532 of the heat dissipating area 531.

The airflow guiding cover 10 is easily adjusted for other electronic devices with different system layout. When the position of the fans 56 and the heat sink 55 is different, or the position of the heat dissipating area 531 is different, the airflow guiding cover 10 is merely adjusted and assembled between the fans 56 and the heat dissipating area 531 to cover the heat sink 55, by adjusting the first airflow guiding portion 20 in the first direction X and the second direction Y.

Figure 4:
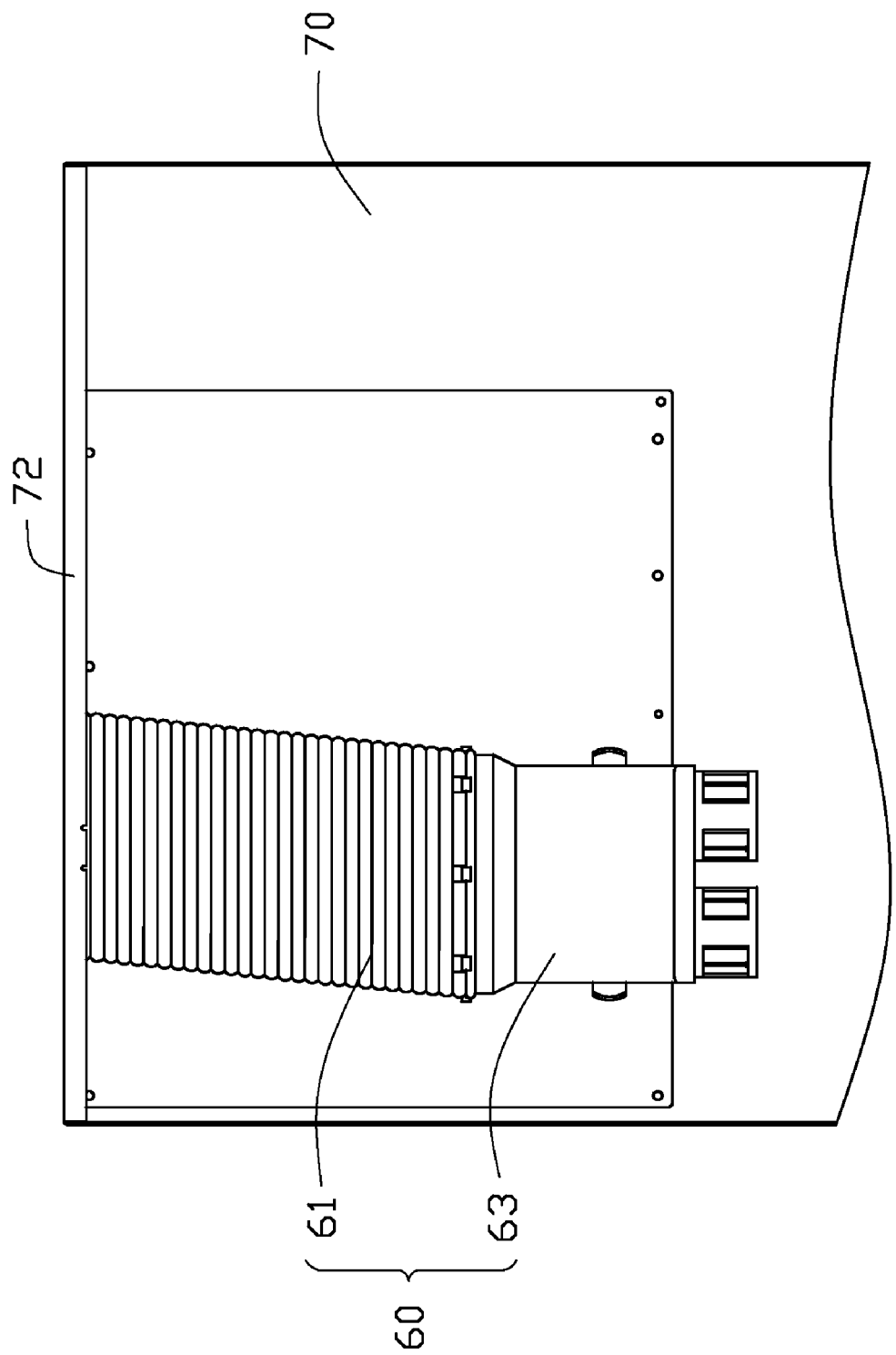
FIG. 4 is an assembled, top plan view of a second embodiment of an airflow guiding cover together with an electronic device.

Referring to FIG. 4, an airflow guiding cover 60 according to a second embodiment of the present disclosure is provided to be mounted to an electronic device 70. The airflow guiding cover 60 includes an adjustable first airflow guiding portion 61, and a second airflow guiding portion 63, which have the same structure as the first airflow guiding portion 20 and the second airflow guiding portion 30 of the first embodiment, respectively. The electronic device 70 includes an end wall 72 forming a plurality of hooks (not shown). The first airflow guiding portion 61 is directly fixed to the end wall 72 of the electronic device 70, by engagement of the hooks of end wall 72 and notches of the first airflow guiding portion 61.

It is to be understood, however, that even though numerous characteristics and advantages of the present disclosure have been set forth in the foregoing description, together with details of the structure and function of the disclosure, the disclosure is illustrative only, and changes may be made in details, especially in matters of shape, size, and arrangement of parts within the principles of the disclosure to the full extent indicated by the broad general meaning of the terms in which the appended claims are expressed.

What is claimed is:

1. An airflow guiding cover for an electronic device, the electronic device comprising an end wall defining a heat dissipating area, a circuit board, a heat sink mounted to the circuit board, and a fan aligning with the heat sink, the airflow guiding cover comprising:
   a first airflow guiding portion configured in an accordion structure, and collapsible and extendable along a first direction and flexible along a second direction perpendicular to the first direction, the first airflow guiding portion comprising a top wall parallel to the circuit board and the first and second directions, and two sidewalls extending down from opposite sides of the top wall parallel to the first direction, wherein corresponding ends of the top wall and the sidewalls of the first airflow guiding portion are connected to the end wall of the electronic device, with the heat dissipating area aligning with an inner of the first airflow guiding portion; and
   a second airflow guiding portion covering the heat sink, with the fan aligning with an inner of the second airflow guiding portion, the second airflow guiding portion comprising a top wall connected to the top wall of the first airflow guiding portion, and two sidewalls extending down from opposite sides of the top wall of the second airflow guiding portion and connected to the sidewalls of the first airflow guiding portion, wherein a latch protrudes from an inner side of each sidewall of the second airflow guiding portion, to engage with the heat sink.

2. The airflow guiding cover of claim 1, wherein the first airflow guiding portion is made of plastic material repeatedly collapsed in the first direction.

3. The airflow guiding cover of claim 1, wherein the first airflow guiding portion is made of a plurality of metal pieces movably connected one by one.

4. The airflow guiding cover of claim 1, wherein a notch is defined in each of the top wall and the sidewalls of the first airflow guiding portion adjacent to the second airflow guiding portion, a hook is formed on each of the top wall and the sidewalls of the second airflow guiding portion adjacent to the first airflow guiding portion, the first and second airflow guiding portions are connected via engagement of the notches and the hooks.

5. The airflow guiding cover of claim 1, wherein an operating portion protrudes from an outer side of each sidewall of the second airflow guiding portion, the sidewalls deform outwardly when the operating portions are pulled outwardly.

6. The airflow guiding cover of claim 1, wherein a handle is formed on a distal end of each operating portion away from the corresponding sidewall.

7. An airflow guiding cover for an electronic device, the airflow guiding cover comprising:
   a substantially U-shaped first airflow guiding portion configured in an accordion-like structure, and collapsible and extendable along a first direction and flexible along a second direction perpendicular to the first direction;
   a substantially U-shaped second airflow guiding portion connected to a first end of the first airflow guiding portion, a latch protruding from an inner side of each of opposite sidewalls of the second airflow guiding portion, to engage with a heat sink; and
   a substantially U-shaped third airflow guiding portion connected to a second end of the first airflow guiding portion opposite to the first end, a locking mechanism formed on a distal end of the third airflow guiding portion away from the first airflow guiding portion, to engage with an end wall of the electronic device.

8. The airflow guiding cover of claim 7, wherein the first airflow guiding portion is made of plastic material repeatedly collapsed in the first direction.

9. The airflow guiding cover of claim 7, wherein the first airflow guiding portion is made of a plurality of metal pieces movably connected one by one.

10. The airflow guiding cover of claim 7, wherein the third airflow guiding portion comprises a top wall and two sidewalls extending down from opposite sides of the top wall.

11. The airflow guiding cover of claim 10, wherein the locking mechanism comprises a triangular-shaped block protrudes outwardly from the top wall.

12. The airflow guiding cover of claim 11, wherein the locking mechanism further comprises two protrusions correspondingly extending from ends of the sidewalls of the third airflow guiding portion away from the first airflow guiding portion.

13. The airflow guiding cover of claim 10, wherein two catches correspondingly extend down from bottoms of the sidewalls of the third airflow guiding portion, to engage with two corresponding slots defined in a circuit board of the electronic device.

14. The airflow guiding cover of claim 7, wherein an operating portion protrudes from an outer side of each sidewall of the second airflow guiding portion, the sidewalls deform outwardly when the operating portions are pulled outwardly.

15. The airflow guiding cover of claim 7, wherein the first airflow guiding portion comprises a top wall and two sidewalls extending down from opposite sides of the top wall, the top wall and the sidewalls of the first airflow guiding portion are parallel to the first direction.

16. An electronic device comprising:
a base board;
a circuit board mounted on the base board;
a heat sink mounted to the circuit board;
a fan aligning with the heat sink;
an end wall extending perpendicularly from the base board and defining a heat dissipating area; and
an airflow guiding cover for the electronic device, comprising:
a first airflow guiding portion configured in an accordion structure, and collapsible and extendable along a first direction and flexible along a second direction perpendicular to the first direction, the first airflow guiding portion comprising a top wall parallel to the circuit board and the first and second directions, and two sidewalls extending down from opposite sides of the top wall parallel to the first direction, wherein corresponding ends of the top wall and the sidewalls of the first airflow guiding portion are connected to the end wall of the electronic device, with the heat dissipating area aligning with an inner of the first airflow guiding portion; and
a second airflow guiding portion covering the heat sink, with the fan aligning with an inner of the second airflow guiding portion, the second airflow guiding portion comprising a top wall connected to the top wall of the first airflow guiding portion, and two sidewalls extending down from opposite sides of the top wall of the second airflow guiding portion and connected to the sidewalls of the first airflow guiding portion, wherein a latch protrudes from an inner side of each sidewall of the second airflow guiding portion, to engage with the heat sink.

17. The electronic device of claim 16, wherein the first airflow guiding portion is made of plastic material repeatedly collapsed in the first direction.

18. The electronic device of claim 16, wherein the first airflow guiding portion is made of a plurality of metal pieces movably connected one by one.

19. The electronic device of claim 16, wherein a notch is defined in each of the top wall and the sidewalls of the first airflow guiding portion adjacent to the second airflow guiding portion, a hook is formed on each of the top wall and the sidewalls of the second airflow guiding portion adjacent to the first airflow guiding portion, the first and second airflow guiding portions are connected via engagement of the notches and the hooks.

* * * * *